United States Patent
Ba et al.

(10) Patent No.: US 8,055,217 B2
(45) Date of Patent: Nov. 8, 2011

(54) ADAPTIVE COMPLEX GAIN PREDISTORTER FOR A TRANSMITTER

(75) Inventors: Seydou Nourou Ba, Richardson, TX (US); Khurram Waheed, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 483 days.

(21) Appl. No.: 12/413,109

(22) Filed: Mar. 27, 2009

(65) Prior Publication Data

US 2010/0035554 A1 Feb. 11, 2010

Related U.S. Application Data

(60) Provisional application No. 61/086,261, filed on Aug. 5, 2008.

(51) Int. Cl.
*H04B 1/04* (2006.01)
(52) U.S. Cl. .................. 455/114.3; 455/126; 455/127.2
(58) Field of Classification Search ........................ None
See application file for complete search history.

(56) References Cited

U.S. PATENT DOCUMENTS

| 7,251,290 B2* | 7/2007 | Rashev et al. ................. 375/296 |
| 2009/0051426 A1* | 2/2009 | Ba et al. ........................ 330/149 |
| 2009/0054016 A1* | 2/2009 | Waheed et al. ............. 455/114.3 |

OTHER PUBLICATIONS

Sung Won Chung et al., "Open-Loop Digital Predistortion Using Cartesian Feedback for Adaptive RF Power Amplifier Linearization", 2001 IEEE, pp. 1449-1452.

(Continued)

*Primary Examiner* — Long Nguyen
(74) *Attorney, Agent, or Firm* — Ronald O. Neerings; Wade James Brady, III; Frederick J. Telecky, Jr.

(57) ABSTRACT

Symbols are transmitted in a Cartesian transmitter by pre-distorting an input signal X having in-phase and quadrature components using a first compensation lookup table operable to hold complex valued entries to carry out in-phase and quadrature compensation pre-distortion with respect to the input signal to form a pre-distorted signal Z. The pre-distorted signal Z is processed to form an output signal Y using a nonlinear element. A complex gain normalization parameter adaptively updated to reflect varying gain of a linear region of the nonlinear element. A normalized feed back signal $\hat{Y}$ is formed using the adaptively updated complex gain normalization parameter. The first compensation lookup table is updated based on the pre-distorted input signal Z and the adaptively normalized feedback signal $\tilde{Y}$.

20 Claims, 12 Drawing Sheets

OTHER PUBLICATIONS

"A Baker's Dozen Magnitude Approximations and Their Detection Statistics", IEEE Transactions on Aerospace and Electronic Systems, vol. AES-12, vo. 1, Jan. 1976, pp. 86-89.

James K. Cavers, "Amplifier Linearization Using a Digital Predistorter with Fast Adaptation and Low Memory Requirements", IEEE Transactions on Vehicular Technology, vol. 39, No. 4, Nov. 1990, pp. 374-382.

James K. Cavers, "Optimum Table Spacing in Predistorting Amplifier Linearizers", IEEE Transactions on Vehicular Technology, vol. 48, No. 5, Sep. 1999, pp. 1699-1705.

H. Besbes et al., "A Fast Adaptive Polynomial Predistorter for Power Amplifiers", 2001 IEEE, pp. 659-663.

John Homer et al., "Quantifying the Effects of Dimension on the Convergence Rate of the LMS Adaptive FIR Estimator", IEEE Transactions on Signal Processing, vol. 46, No. 10, Oct. 1998, pp. 2611-2615.

Michael Faulkner and Mats Johansson, "Adaptive Linearization Using Predistortion-Experimental Results", IEEE Transactions on Vehicular Technology, vol. 43, No. 2, May 1994, pp. 323-332.

Lars Sundstrom et al., "Quantization Analysis and Design of a Digital Predistortion Linearizer for RF Power Amplifiers", IEEE Transactions on Vehicular Technology, vol. 45, No. 4, Nov. 1996, pp. 707-719.

Ilari Teikari et al., "Baseband Digital Predistorter with Quadrature Error Correction", 2004 IEEE, pp. 159-162.

Khurram Waheed and Seydou N. Ba, "Adaptive Digital Linearization of a DRP based EDGE Transmitter for Cellular Handsets", IEEE MWSCAS/NEWCAS Conference, Aug. 2007, Montreal, Canada, pp. 706-709.

\* cited by examiner

ADAPTIVE COMPLEX GAIN PREDISTORTER FOR A TRANSMITTER

CLAIM OF PRIORITY UNDER 35 U.S.C. 119(e)

The present application claims priority to and incorporates by reference U.S. Provisional Application No. 61/086,261 filed Aug. 5, 2008, entitled "Adaptive Complex Gain Predistorter for a Handset Transmitter with Adaptive Gain/Phase Equalization".

FIELD OF THE INVENTION

The invention is directed, in general, to wireless transmitters and, more specifically, to an apparatus and method for adaptive Cartesian transmitter linearization and a wireless transmitter for use in cellular telephony and communication devices such as Bluetooth, WLAN, etc. using all-digital radio frequency (RF) circuitry.

BACKGROUND OF THE INVENTION

Wireless cellular communication networks incorporate large numbers of mobile user equipment (UEs) and a number of base nodes (NodeBs). A NodeB is generally a fixed station, and may also be called a base transceiver system (BTS), an access point (AP), a base station (BS), or some other equivalent terminology. As improvements of networks are made, the NodeB functionality evolves, so a NodeB is sometimes also referred to as an evolved NodeB (eNB). In general, NodeB hardware, when deployed, is fixed and stationary, while the UE hardware is typically portable.

In contrast to NodeB, the mobile UE can comprise portable hardware. User equipment (UE), also commonly referred to as a terminal or a mobile station, may be fixed or mobile device and may be a wireless device, a cellular phone, a personal digital assistant (PDA), a wireless modem card, and so on. Uplink communication (UL) refers to a communication from the mobile UE to the NodeB, whereas downlink (DL) refers to communication from the NodeB to the mobile UE. Each NodeB contains radio frequency transmitter(s) and the receiver(s) used to communicate directly with the mobiles, which move freely around it. Similarly, each mobile UE contains radio frequency transmitter(s) and the receiver(s) used to communicate directly with the NodeB. In cellular networks, the mobiles cannot communicate directly with each other but have to communicate with the NodeB.

With each successive cellular phone handset generation, users demand more features in a smaller form factor. Some recent examples include cell phones with integrated Bluetooth, GPS, digital camera, and MP3 functionality. Process shrinks help deliver a cost and size advantage for digital designs with relative ease. However, for analog/RF designs, the immaturity of advanced processes comes with design challenges that may outweigh the intended advantage. In a typical handset, 30 to 40% of handset board space is occupied by analog/RF functionality which cannot be re-designed or migrated to the newer process/technology nodes easily, inhibiting vendor ability to cost effectively add features and reduce footprint.

Digital radio has recently allowed the replacement of space consuming analog RF circuitry with much more compact digital circuitry, thereby facilitating the ability to port designs rapidly to more advanced lithographies. Texas Instruments (TI) has proven this concept with its Digital RF Processor (DRP™) architecture, which it has successfully implemented in production versions of its Bluetooth BRF6xxx transceivers, GSM/GPRS LoCosto TCS23xx transceivers among other chips. DRP implementation is consistent with the ongoing trend toward RF-CMOS in the cellular area, making it attractive in terms of power consumption, cost, and the integration of multiple radios.

Transmitters use one or more amplifiers, such as a digital pre-power amplifier (PPA) and an external power amplifier (PA), to amplify components of the input signal to be transmitted. These components are in-phase and quadrature components in the case of a Cartesian transmitter.

A highly linear amplifier distorts the signal the least and so is most favored from a standpoint of signal quality. Unfortunately, highly linear amplifiers use relatively large amounts of power and numbers of highly accurate and tightly matched components, making them relatively power consumptive, large and expensive. Though they perform the best, they are thus disfavored in many wireless applications, particularly those that require low-cost transmitters or transmitters that are subject to large operating voltage excursions. The amplifier that is best suited overall for low-cost, battery-powered wireless transmitters is a simpler amplifier having significant nonlinearities.

Predistortion is often used to compensate for these nonlinearities, resulting in a linearization of the output of the amplifier. The theory underlying predistortion is that if an amplifier's distortion characteristics are known in advance, an inverse function can be applied to an input signal to predistort it before it is provided to the amplifier. Though the amplifier then distorts the signal as it amplifies it, the predistortion and the amplifier distortion essentially cancel one another, resulting in an amplified output signal having substantially reduced distortion.

In digital transmitters, digital predistortion (DPD) is most often carried out using a lookup table (LUT) that associates output values with input signal values. Entries in the LUT are addressed using samples of the input signal. The output values retrieved from the LUT are used either to modify the samples (an "inverse gain" configuration) or in lieu of the samples (a "direct mapping" configuration). In modern applications such as WCDMA, samples are transmitted at a very high rate. Thus, the predistorter needs to be able to look up and retrieve output values very quickly.

WCDMA Cartesian transmitters suffer nonlinearities resulting from both amplitude modulation (AM) and phase modulation (PM), namely AM-AM and AM-PM interactions, occurring in their amplifier(s). In such Cartesian transmitters, predistortion is carried out at least partially to negate the effect of these interactions.

Values for a nominal predistortion LUT are typically computed during initial factory calibration. Unfortunately, a factory-calibrated predistortion LUT often fails to linearize the amplifier(s) adequately under varying operational conditions (e.g., temperature, voltage, frequency and voltage standing-wave ratio, or VSWR). Aging, especially in WCDMA and other so-called "3G" transmitters, only exacerbates the inadequacy.

BRIEF DESCRIPTION OF THE DRAWINGS

Particular embodiments in accordance with the invention will now be described, by way of example only, and with reference to the accompanying drawings.

DETAILED DESCRIPTION OF EMBODIMENTS OF THE INVENTION

Figure 1:
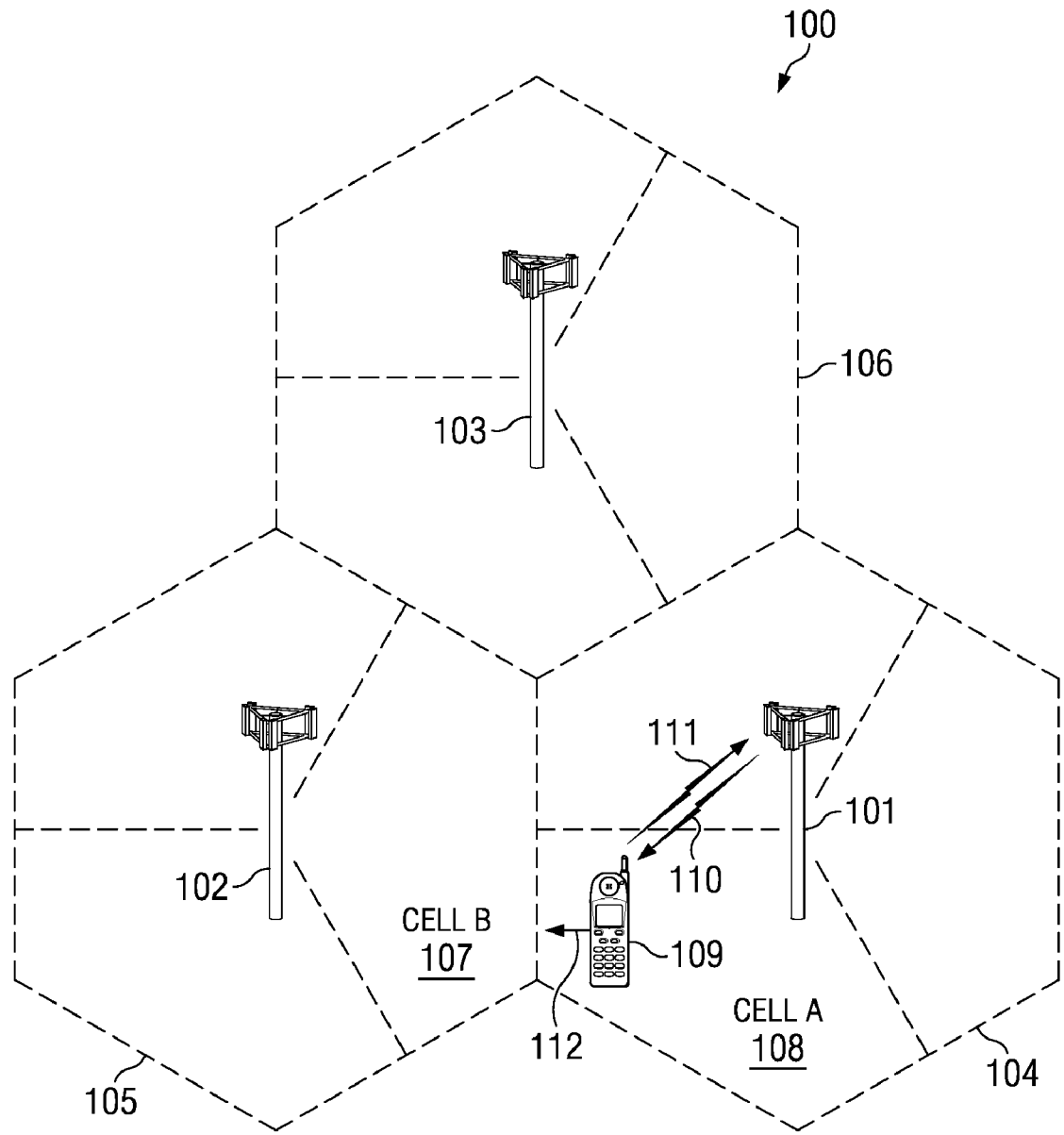
FIG. 1 is a pictorial of an illustrative telecommunications network that employs an embodiment of adaptive gain normalization and predistortion in transceivers used in the network.

Embodiments of the present invention include adaptive digital linearization techniques for a Cartesian WCDMA transmitter. A digital Predistortion block implemented as a digital lookup table (LUT) is used to predistort the complex baseband signal (Inphase and Quadrature components) of a WCDMA Cartesian transmitter. The transmitter non-linearity is assumed to be dominant in the post combination devices such as Pre-power Amplifier (PPA) and/or the external Power amplifier. As result the dominant nonlinearity will be a function of the complex magnitude of the baseband signal as opposed to the magnitude of Inphase and Quadrature components (such as is the case for the DAC and mixer nonlinearity). These non-linearities distort the I/Q signal constellation that is transmitted by the TX, thus causing poor error vector magnitude (EVM) and spectral degradation, which is observed as a degradation of the adjacent channel leakage power/ratio (ACLP/ACLR) and possibly increased broadband noise.

To aid in understanding the principles of the present invention, a description is provided in the context of a digital RF processor (DRP) transmitter and receiver that may be adapted to comply with a particular wireless communications standard such as GSM (Global System for Mobile communication), Bluetooth, WCDMA (Wideband Code Division Multiple Access), etc. It is appreciated, however, that the invention is not limited to use with any particular communication standard and may be used in control, optical, wired and wireless applications. Further, the invention is not limited to use with a specific modulation scheme but is applicable to any modulation scheme including both digital and analog modulation.

Note that throughout this document, the term communications device is defined as any apparatus or mechanism adapted to transmit, or transmit and receive data through a medium. The communications device may be adapted to communicate over any suitable medium such as RF, wireless, infrared, optical, wired, microwave, etc. In the case of wireless communications, the communications device may comprise an RF transmitter, RF receiver, RF transceiver or any combination thereof. The notation DRP is intended to denote either a Digital RF Processor or Digital Radio Processor. References to a Digital RF Processor infer a reference to a Digital Radio Processor and vice versa.

In an embodiment of the invention, a least means squared (LMS) based adaptation technique may be used for a complex gain lookup table (LUT) to track the temperature variations of the transmitter's nonlinear characteristics during operation. The algorithm is optimized to enable a low complexity hardware implementation and provides relatively fast convergence. An amplitude approximation method that is suitable to address the complex gain LUT is described that avoids the computation of square root. Also, an adaptive loop gain/phase normalization technique is described that avoids the appearance of curve discontinuities and maintains the accuracy of open loop power control. It reuses the existing LUT adaptation hardware and therefore is inexpensive to implement.

FIG. 1 shows an exemplary wireless telecommunications network 100. The illustrative telecommunications network includes representative base stations 101, 102, and 103; however, a telecommunications network necessarily includes many more base stations. Each of base stations 101, 102, and 103 are operable over corresponding coverage areas 104, 105, and 106. Each base station's coverage area is further divided into cells. In the illustrated network, each base station's coverage area is divided into three cells. Handset or other UE 109 is shown in Cell A 108, which is within coverage area 104 of base station 101. Base station 101 is transmitting to and receiving transmissions from UE 109 via downlink 110 and uplink 111. As UE 109 moves out of Cell A 108, and into Cell B 107, UE 109 may be handed over to base station 102. A UE in a cell may be stationary such as within a home or office, or may be moving while a user is walking or riding in a vehicle. UE 109 moves within cell 108 with a velocity 112 relative to base station 102.

In one embodiment of the invention, UE 109 is transmitting to and receiving from base station 101 voice and/or data transmissions. As the UE moves around in the network and is placed in different environments such as in a pocket or purse, carried to hot or cold environments such as indoors and outdoors, placed in the sun, and so on, the resulting extreme changes in temperature will cause differences in the performance of analog components used in the transmitter. An adaptive loop gain/phase normalization mechanism along with an adaptive predistorter is used to compensate for these temperature variations, as will be explained in more detail below.

Figure 2:
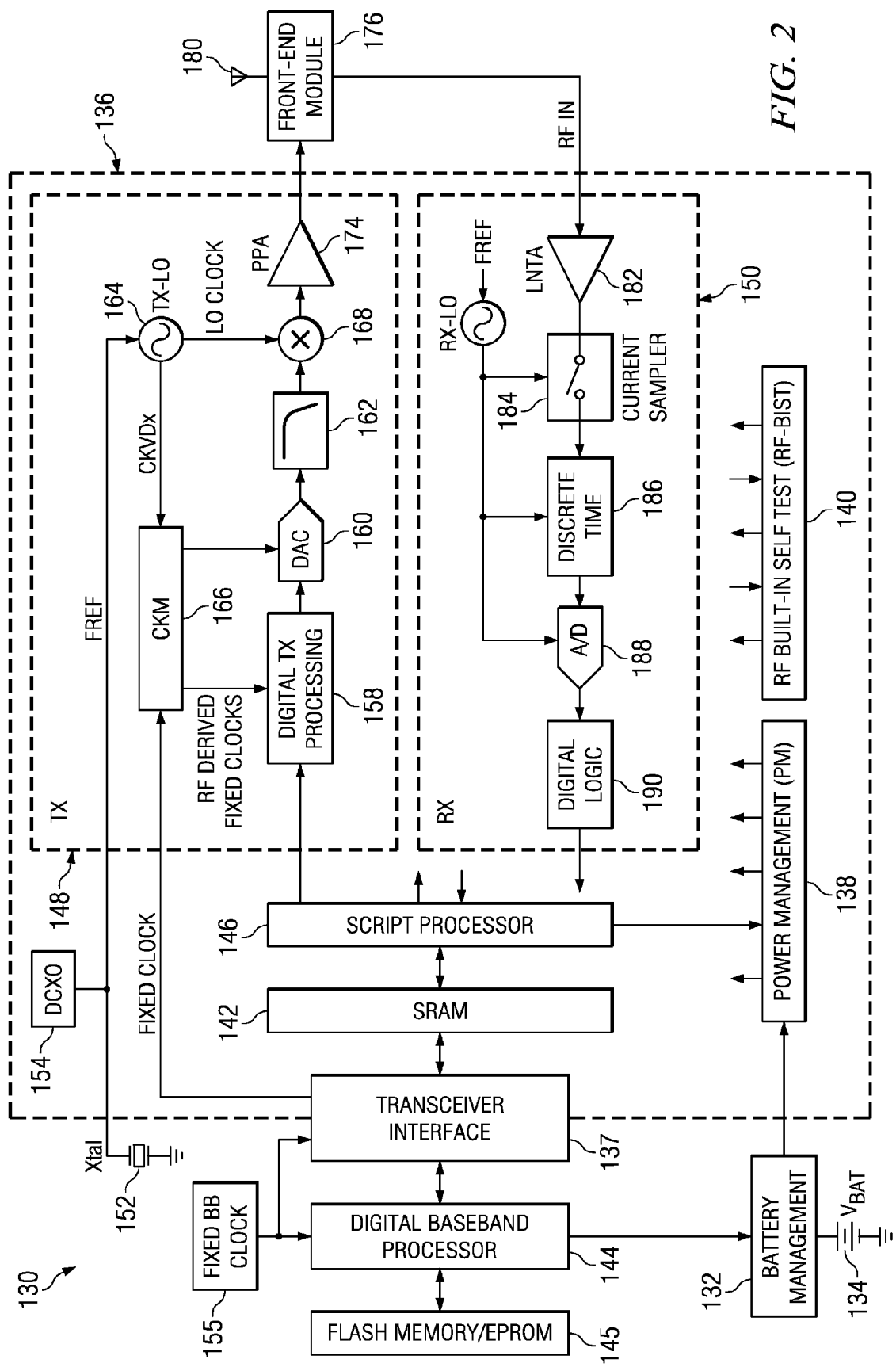
FIG. 2 is a block diagram of a single-chip radio with an all-digital local oscillator and transmitter that performs predistortion.

A block diagram illustrating a single chip radio incorporating an interpolative all-digital local oscillator based Cartesian transmitter and digitally-intensive receiver is shown in FIG. 2. For illustration purposes only, the transmitter, as shown, is adapted for the EDGE/WCDMA cellular standards. It is appreciated, however, that one skilled in the communication arts can adapt the transmitter illustrated herein to other modulations and communication standards as well without departing from the spirit and scope of the present invention. This embodiment of a DRPu for UMTS is a Digital RF Processor (DRP)-based dominantly digital transceiver integrated with a digital baseband processor in 45 nm CMOS technology. This DRPu EDGE/WCDMA (2.5G/3G) transmitter (TX) is based on a Cartesian (I/Q) direct up-conversion TX architecture with digital assistance for calibrations and compensation, henceforth termed as a Digitally Assisted analog I/Q (DAIQ) TX. For GSM (2G), the transmitter architecture is small-signal analog polar. DRP supports interface with both multi-mode and multi-band power amplifiers (PA).

The radio circuit, generally referenced 130, comprises a transceiver integrated circuit (IC) 136 coupled to a crystal 152, antenna front end module 176 connected to antenna 180 and battery management circuit 132. The radio chip 136 comprises a script processor 146, memory 142 (e.g., static RAM), transmit (TX) block 148, receiver (RX) block 150, digitally controlled crystal oscillator (DCXO) 154, slicer 156, power management unit 138, RF built-in self test (BIST) 140. Battery 134 and battery management circuit 132 are connected to radio chip 136 for providing power. Digital baseband (DBB) processor 144 and flash memory/EEPROM 145 is coupled to transceiver IC 136 via transceiver interface 137.

The TX block 148 comprises high speed and low speed digital logic block 158, digital to analog converter 160, low pass filter 162, amplitude modulator 168, digitally controlled oscillator (DCO) 164, digitally controlled pre-power amplifier 174. The transmitter generates various radio frequency signals, as defined by the 3GPP specifications. For example, the transmitter may support one or more of the 3 G UMTS frequencies: 850, 900, 1700, 1900, or 2100 MHz.

A key component of transmitter block 148 is digitally controlled oscillator (DCO) 164, that is part of an interpolated-digital phase-locked loop (ADPLL). DCO 164 avoids any analog tuning controls. The DCO generates a high-quality base station-synchronized frequency reference such that the transmitted carrier frequencies and the received symbol rates are accurate to within 0.1 ppm. Fine frequency resolution is achieved through high-speed sigma-delta ($\Sigma\Delta$) dithering of its varactors. Digital logic built around the DCO realizes an interpolated all-digital PLL (ADPLL) that is used as a local oscillator for both the transmitter and receiver. The Cartesian transmitter architecture utilizes a digitally controlled power amplifier (DPA) 174 for the amplitude modulation. It is followed by a matching network and an external antenna front-end module 176, which comprises a power amplifier (PA), a transmit/receive switch for the common antenna 180 and RX surface acoustic wave (SAW) filters.

An advanced All-Digital PLL (ADPLL) frequency synthesizer is described in US Patent application 2008-0315960 to Waheed et al entitled "Digital Phase Locked Loop with Gear Shifting" which is incorporated by reference herein in its entirety.

Fixed baseband clock circuit 155 provides a fixed clock to DBB processor 144 and to transceiver interface 137. Clock module 166 receives a variable clock from DCO 164 and produces a set of synchronized RF derived clocks for use by digital processing module 158 and DAC 160. Clock module 166 also receives a clock signal from transceiver interface 137 that is used to allow synchronization of clocks between fixed clock 155 and variable clocks derived from DCO 164.

The receiver employs a discrete-time architecture in which the RF signal is directly sampled and processed using analog and digital signal processing techniques. RX block 150 comprises a low noise transconductance amplifier 182, current sampler 184, discrete time processing block 186, analog to digital converter (ADC) 188 and digital logic block 190. The receiver 150 employs a discrete-time architecture in which the RF signal is directly sampled at the Nyquist rate of the RF carrier and processed using analog and digital signal processing techniques. The transceiver is integrated with a script processor 146, dedicated digital base band processor 144 (i.e. ARM family processor and DSP) and SRAM memory 142. The script processor handles various TX and RX calibration, compensation, sequencing and lower-rate data path tasks and encapsulates the transceiver complexity in order to present a much simpler software programming model.

The frequency reference (FREF) is generated on-chip by a 38.4 MHz (but could be 26.0 MHz or another frequency in another embodiment) digitally controlled crystal oscillator (DCXO). An integrated power management (PM) system is connected to an external battery management circuit 132 that conditions and stabilizes the supply voltage. The PM comprises a switched mode power supply (SMPS) as well as multiple low drop out (LDO) regulators that provide internal supply voltages and also isolate supply noise between circuits, especially protecting the DCO. The SMPS is used for efficient conversion of the battery voltage to a level that can be used by on-chip LDOs. The RF built-in self-test (RFBIST) 140 performs autonomous phase noise and modulation distortion testing, various loopback configurations for bit-error rate measurements and implements various DPA calibration and BIST procedures.

In another embodiment, the transceiver may be integrated with the digital baseband processor 144 and flash memory 145 memory in a complete system-on-chip (SoC) solution.

Figure 3A:
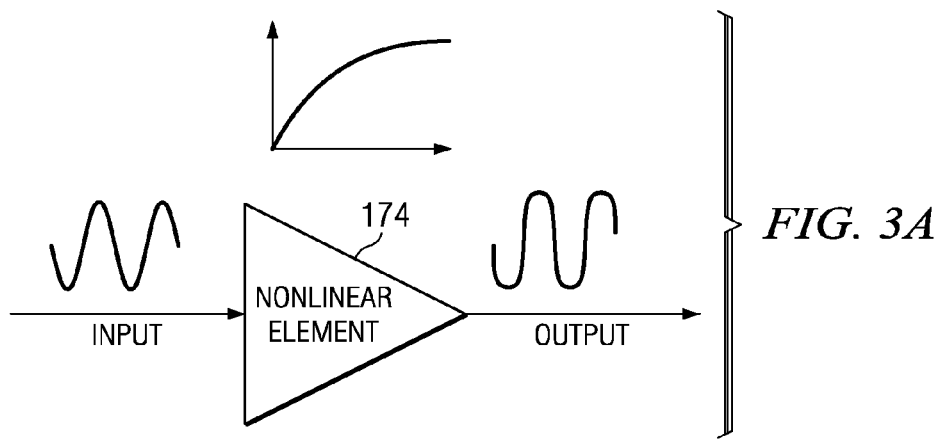
FIGS. 3A and 3B are plots illustrating nonlinear operation of the transmitter of FIG. 2.
Figure 3B:
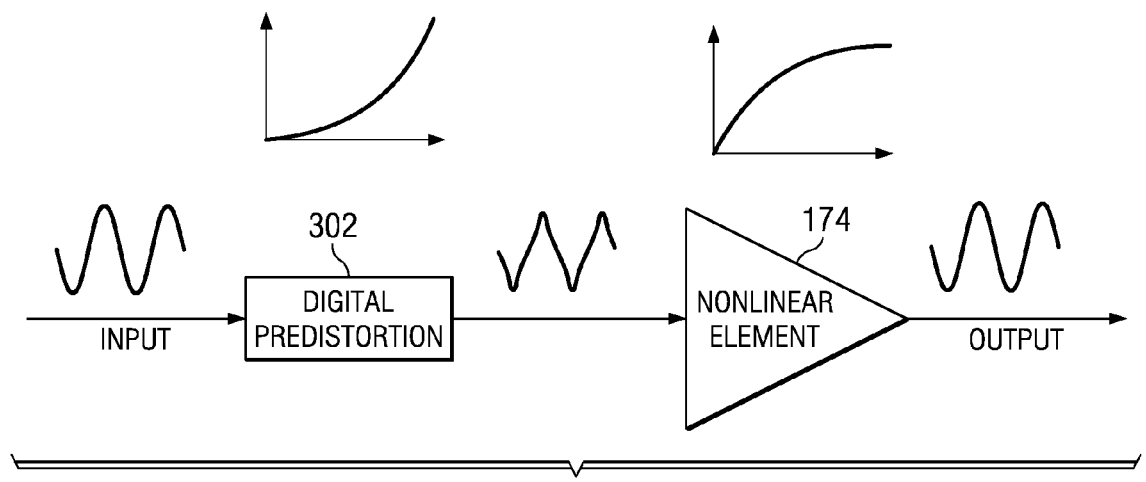

FIGS. 3A and 3B are plots illustrating nonlinear operation of the transmitter of FIG. 2. FIG. 3A illustrates in general how nonlinear amplifier 174, which is representative of PPA 174 in FIG. 2, distorts a substantially sinusoidal input signal. In FIG. 3B, predistortion module 302 is used to compensate for these nonlinearities, resulting in a linearization of the output of the amplifier. The theory underlying predistortion is that if an amplifier's distortion characteristics are known in advance, an inverse function can be applied to an input signal to predistort it before it is provided to the amplifier. Though the amplifier then distorts the signal as it amplifies it, the predistortion and the amplifier distortion essentially cancel one another, resulting in an amplified output signal having substantially reduced distortion in which a digital predistorter 302 predistorts the substantially sinusoidal input signal such that the output signal is likewise sinusoidal.

Predistorter 302 is embodied as a look-up table (LUT) that is indexed by the input signal. At each instant of the input signal, the LUT is indexed by a representation of the input signal and the output of the LUT scales the input signal in response to the value at the indexed location in the LUT. In order to compensate for changes in temperature, Predistorter 302 needs to be continually updated. Existing complex gain LUT predistorters with sample-based update do not address the potential discontinuities due to the local nature of the LUT update. These discontinuities appear when the temperature changes greatly and only part of the LUT is updated. This highly undesirable behavior in overcome by adaptive gain/phase normalization as will be described in more detail below.

Figure 4A:
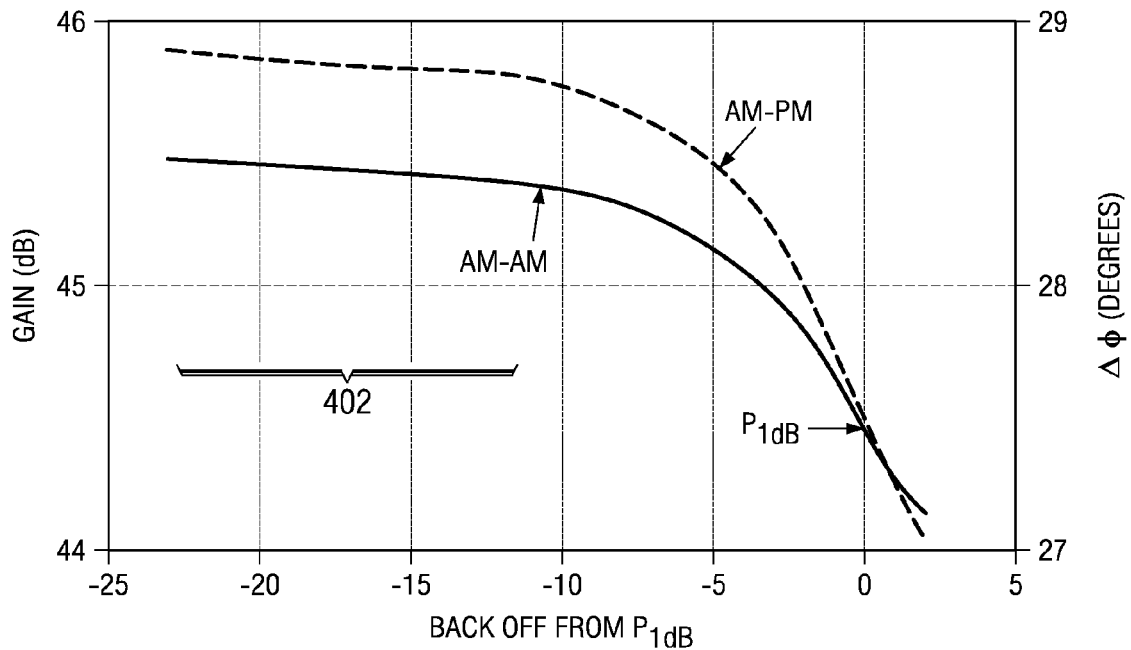
FIGS. 4A and 4B are plots illustrating typical Class A and Class C, respectively, operation of the transmitter amplifier of FIG. 2.
Figure 4B:
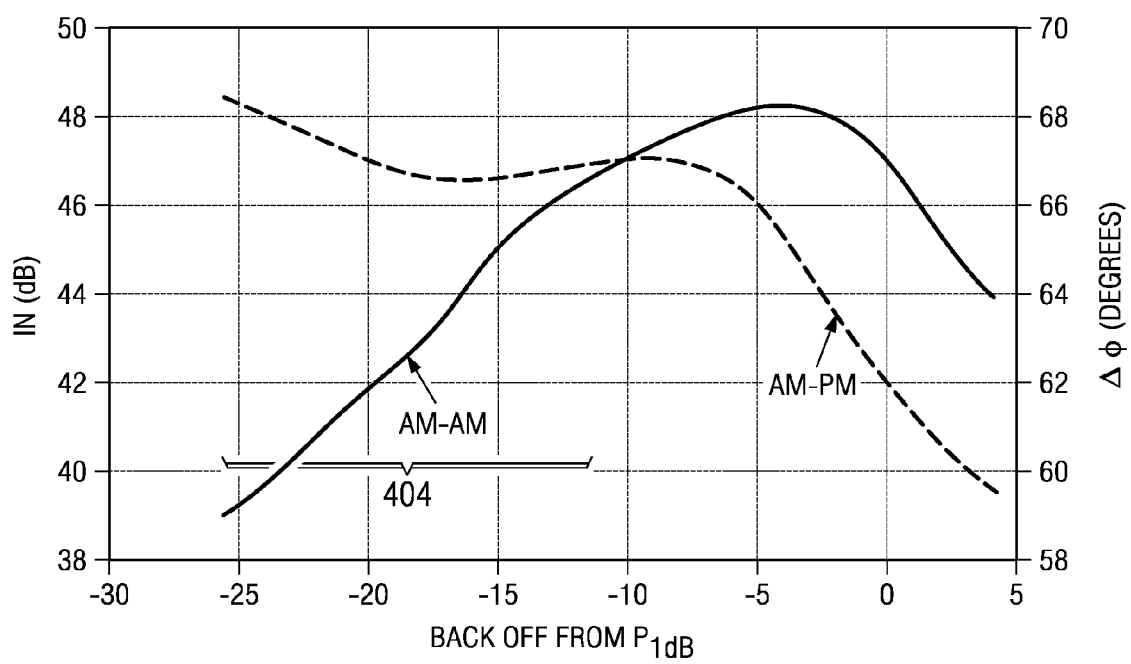

FIGS. 4A and 4B are plots illustrating typical Class A and Class C, respectively, operation of the transmitter amplifier of FIG. 2. The nonlinearity of the PPA/PA distorts the combined RF signal. The distortion is caused by the amplitude depend gain and phase shift of the PPA/PA. the distortion is modeled by a complex gain F(r). The AM-AM and AM-PM are respectively given by the amplitude dependant magnitude and angle of F(r). Examples of AM-AM and AM-PM curves are shown FIGS. 4A and 4B.

Figure 5:
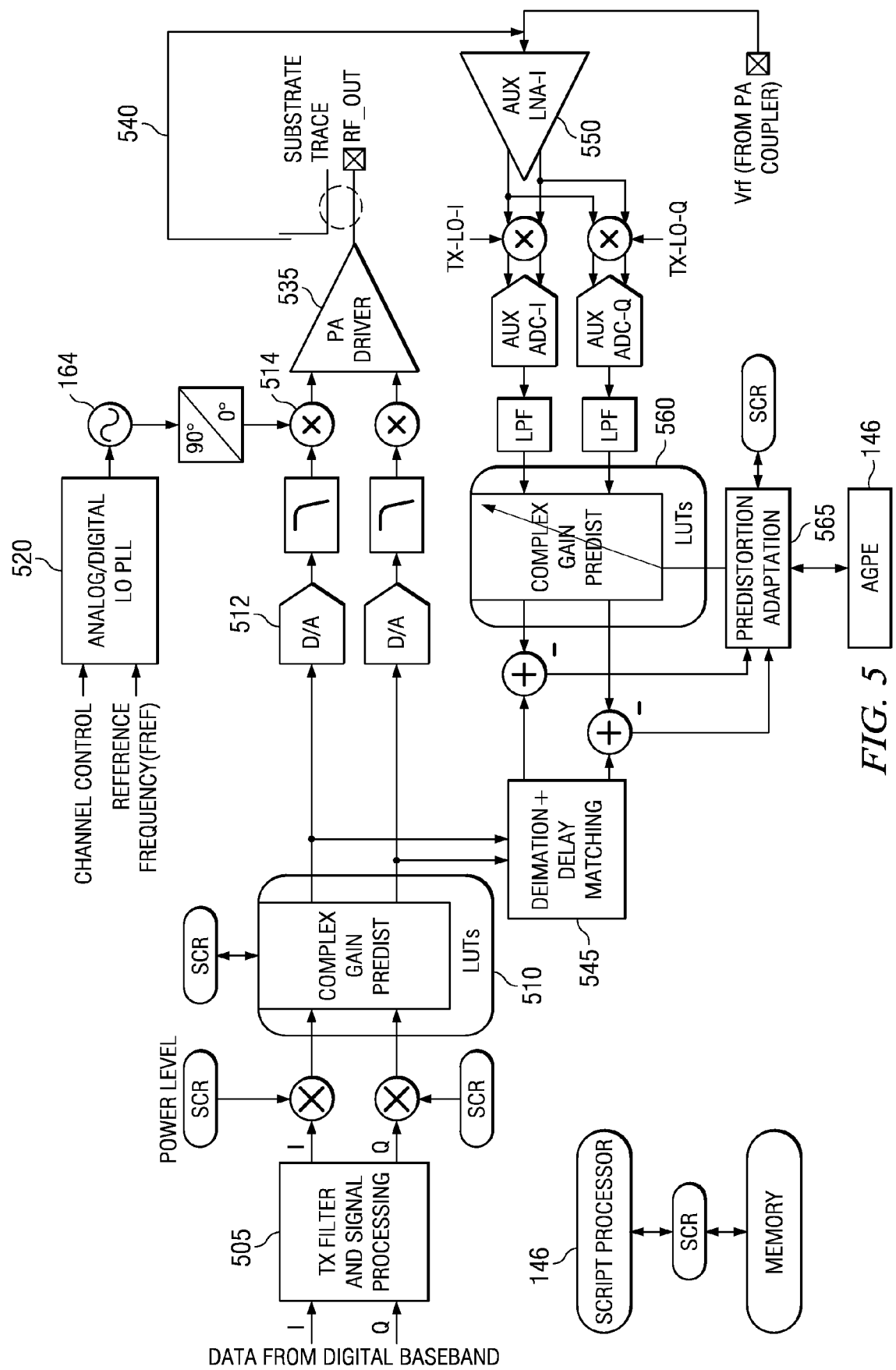
FIG. 5 is a more detailed block diagram of the transmitter portion of the radio of FIG. 2 that embodies adaptive gain normalization and predistortion.

FIG. 5 is a more detailed block diagram of the transmitter portion of the radio of FIG. 2 that embodies adaptive gain normalization and predistortion in a Cartesian transmitter. Digital baseband processor 144 (illustrated in FIG. 2) produces in-phase and quadrature components I and Q. A filter block 505 conditions I and Q for amplification. Cartesian predistortion LUT 510 is a single LUT that is initially loaded with calibration based entries and then is updated adaptively.

It is employed to produce predistorted amplitude and phase components $I_Z$ and $Q_Z$. $I_Z$ and $Q_Z$ are converted to analog form, filtered and modulated as shown and provided to the PPA 535, yielding the WCDMA output signal. $I_Z$ and $Q_Z$ are also provided to the decimator and aligner 545 to be used in temperature adaptation. Phase locked loop 520 is representative of the ADPLL in FIG. 2 that includes digitally controlled oscillator 164.

A coupler 540 provides a portion of the WCDMA output signal to the input of a receiver. In this embodiment coupler 540 is a signal trace on the circuit substrate. The receiver employs a low noise amplifier (LNA) 550 to yield RF signals that are then down-converted to produce in-phase and quadrature components $I_Y$ and $Q_Y$ of the WCDMA output signal, which are then filtered in low pass filters (LPF) as shown. A second Cartesian predistortion LUT 560 also has one LUT that holds complex valued entries in this embodiment. LUT 560 post-distorts $I_Z$ and $Q_Z$. The differences between these amplitude and phase components and those provided via the decimator and aligner 645 are provided to a predistortion adapter 665 which updates predistortion in the complex compensation LUT of the second Cartesian predistortion LUT 560. The second Cartesian predistortion LUT 560 are then exchanged with the first Cartesian predistortion LUTs 510 for the next lookup. The first Cartesian predistortion LUTs 510 are updated during that next lookup, the first and second Cartesian predistortion LUTs 510, 560 are exchanged again for the lookup after that, and so on.

The feedforward predistortion may be either a direct mapping in which the value of an incoming complex signal determines the complex predistorted value, or a complex scaling term in which the value of an incoming complex signal is scaled by the complex value in the LUT.

The Cartesian transmitter of FIG. 5 features three potentially nonlinear elements in both of its I and Q paths. These elements include the digital-to-analog converter (DAC) 512, the PPA 514, possibly including AM-AM and AM-PM nonlinearities, and PA 535, again possibly including AM-AM and AM-PM nonlinearities.

Figure 6:
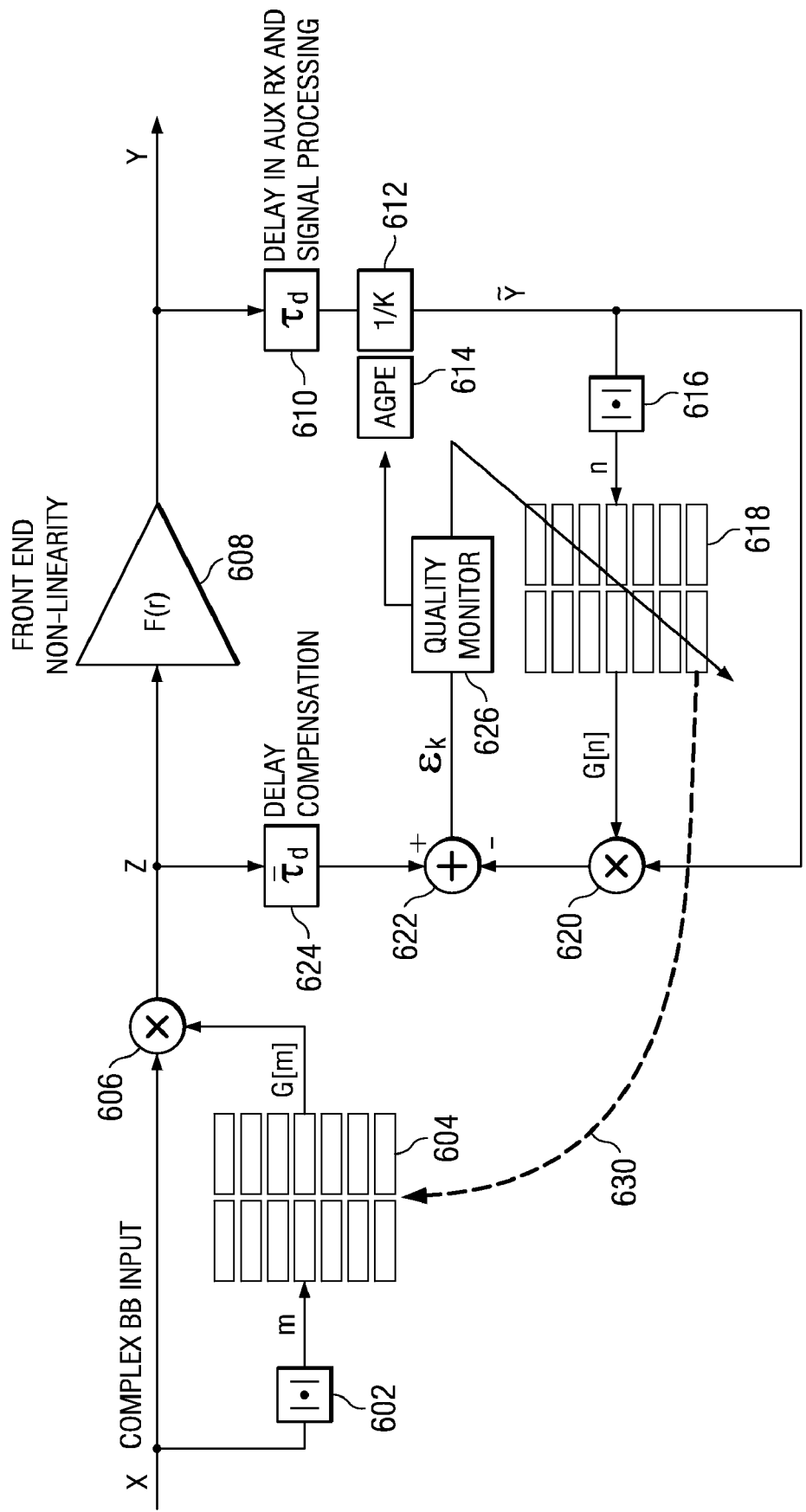
FIG. 6 is a more detailed block diagram of the adaptive predistortion mechanism of the transmitter of FIG. 5.

FIG. 6 is a more detailed block diagram of the adaptive predistortion mechanism of the transmitter of FIG. 5. The distortion is modeled by a complex gain F(r). The AM-AM and AM-PM are respectively given by the amplitude dependant magnitude and angle of F(r).

An input signal X is provided to predistortion LUT 604 that contains complex predistortion scaling parameters. The complex output of LUT 604 and the complex input signal X are multiplied in a scaling module 606 and provided as input to a nonlinear element 608, which provides an output signal Y. A receiver feeds back the output signal Y, incurring some delay. An output delay circuit 610 represents that delay. This signal is then normalized by normalization block 612 that multiples the feedback signal by a complex gain normalization parameter that is roughly equivalent to an inverse of the gain of the front end components. An input delay circuit 624 delays the output of scaling module 606 by an equivalent amount.

A second compensation LUT 618 receives the normalized feedback signal $\tilde{Y}$. The complex output of the second compensation LUT is multiplied with the feedback signal $\tilde{Y}$ in scaling module 620. A summing junction 622 provides the difference signal $\epsilon_k$ between the two delayed signals to a quality monitor 626. The quality monitor uses an iterative LMS-like approach to update the second compensation LUT 618 to minimize the difference. The exact method of performing the update will be described in more detail below. The compensation predistorter is adapted during transmission using the symbols that are being transmitted. The compensation predistorter continuously changes until a steady state is reached when the feedback error reaches zero. After an entry in second LUT 618 is updated, multiplexing logic that controls the LUTs is toggled so that the feed-forward predistortion points to the newly updated table and the adaptation points to the other LUT, as indicated at 630.

Adaptive gain/phase equalization module 614 updates normalization block 612 to compensate for changes in loop gain due to temperature and voltage variations that affect the operation of analog components of the transmitter. The transmitter's nonlinearity varies over time because of temperature fluctuations, but also fast varying loading conditions (VSWR). Inaccuracies in the gain normalization can cause the predistorter curves to vary drastically. Since the update is local this potentially causes temporary discontinuities in the LUT curves that could degrade the transmitter's performance. An adaptive gain normalization that reuses the predistorter update hardware mitigates this issue.

The adaptive normalization mechanism is operable to temporarily substitute a single register for the second compensation lookup table 618 while updating the complex gain normalization parameter. As will be described in more detail below, the adaptive normalization mechanism iteratively converges on a revised gain normalization parameter using the single register to determine a complex value equal to approximately the inverse of a combined gain of the non-linear device over a linear region and components of the feedback loop, such that a resulting loop gain is approximately one.

First LUT 604 is indexed using a representation of the input signal X. Amplitude computation through the formula $$\sqrt{I^2+Q^2}$$

has a high computational complexity. As a result most the practical implementations use the squared amplitude instead]. In this disclosure an amplitude approximation suitable for the complex gain predistorter configuration is used. This approximation allows very efficient hardware implementation and has even lower computational complexity than the squared amplitude indexing. Approximation module 602 determines an approximate value corresponding to each sample of input signal X that is used to index first LUT 604. Similarly, approximation module 616 determines an approximate value corresponding to each sample of feedback signal $\tilde{Y}$ that is used to index second LUT 618. The operation of the approximation modules will be described in more detail below.

As described above, the predistorter is realized with a lookup table storing the imaginary and real parts of the complex gain. The transmitter is perfectly linearized when the following condition is satisfied:

$$X \times G[m] \times F(|X \times G[m]|) = K \times X$$
$$\Rightarrow G[m] \times F(|X \times G[m]|) = K$$

The parameter K is the desired gain of the linearized transmitter.

The present adaptation technique using a feedback path can be used for both factory self-calibration and online update. A low complexity update equation is obtained by applying the least mean squares (LMS) algorithm. The error $\epsilon_k$ produced by error detection module 622 is given by:

$$\epsilon_k = Z - \text{LUT}[n] \times \tilde{Y}$$

The goal is to minimize an objective function which is the mean squared error:

$$E(|\varepsilon_k|^2) \approx (Z - \tilde{Y} \times LUT[n]) \times (Z - \tilde{Y} \times LUT[n])^*$$

The update equation is then given by:

$$LUT[n] = LUT[n] - \frac{\mu}{2} \times \frac{\partial E\lfloor |\varepsilon_k|^2 \rfloor}{\partial LUT[n]} \quad (1)$$

$$\approx LUT[n] + \mu \times \tilde{Y}^* \times \varepsilon_k$$

where:
LUT[n] indicates an entry in the second compensation lookup table,
$\tilde{Y}^*$ is a complex conjugate value of the normalized feedback signal $\tilde{Y}$.
$\varepsilon_k$ is an error signal corresponding to a difference between pre-distorted signal Z and post-distorted signal Zfb; and
$\mu$ is an update factor (real-valued) that controls the speed of convergence.

The above update equations (1) require only two complex multipliers, one for the computation of the error and one for update, and two complex adders. A prior scheme required four complex multipliers and a division and is therefore unsuitable to low cost cellular handset design.

Figure 7A:
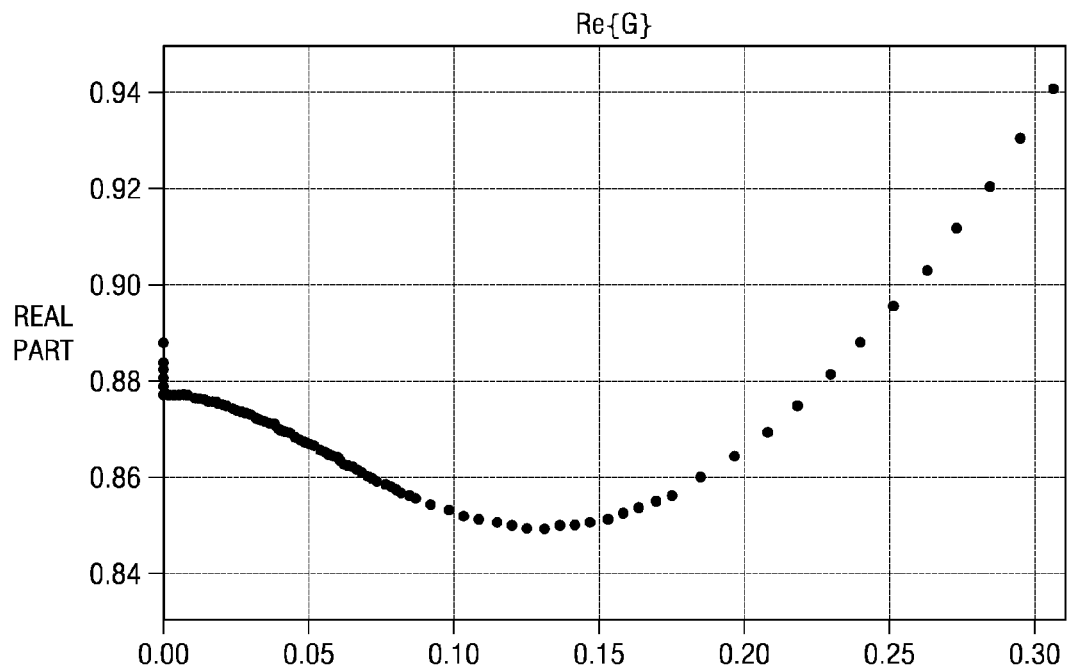
FIGS. 7A and 7B are plots illustrating entries in a complex look up table used in the predistortion mechanism of FIG. 6.
Figure 7B:
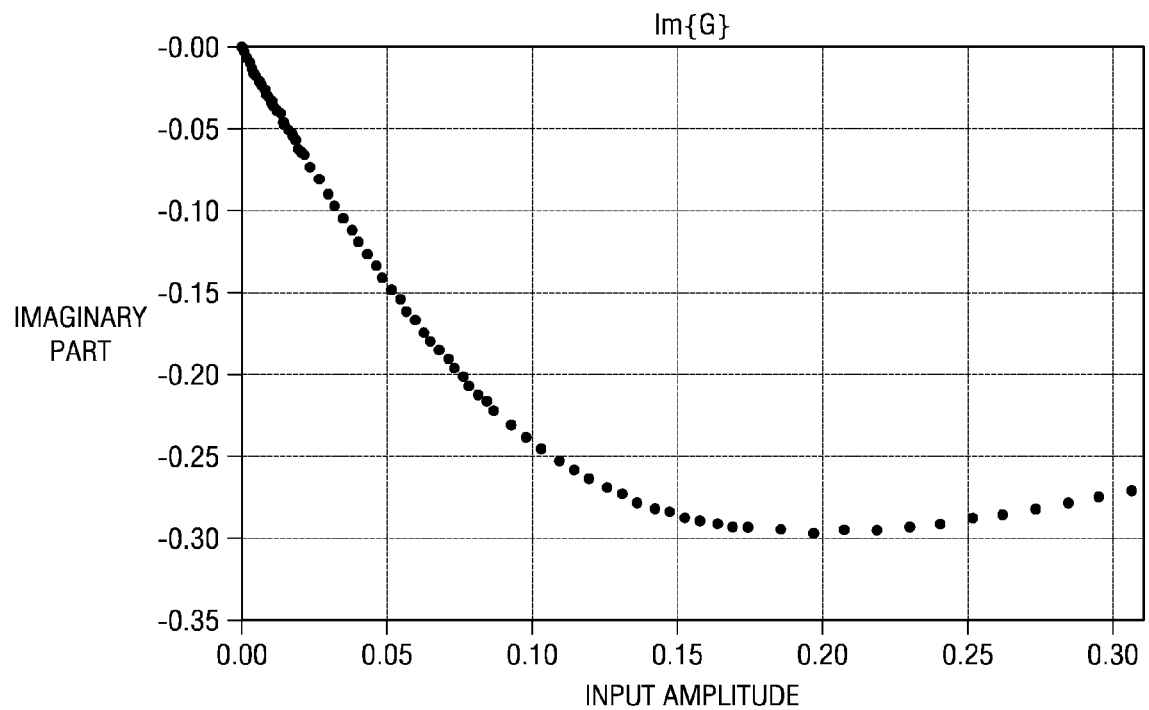

FIGS. 7A and 7B are plots illustrating entries in a complex look up table used in the predistortion mechanism of FIG. 6. These entries are determined by quality monitor 626 performing the update operation described above.

Low Hardware Complexity Update Calculation

The feed forward signal Z ($Z=I_p+jQ_p$) and feedback signal Y ($Y=I_o+jQ_o$) signals are fed to the error detection block 622 which computes a complex error value (I and Q paths) based on these inputs. This error is used to calculate the updated LUT 618 entries as discussed above. The error is given by:

$$\varepsilon_k = Z - LUT[n] \times Y$$

$$\varepsilon_k = (I_p + jQ_p) - LUT[n] \times (I_o + jQ_o)$$

The complex gain LUT[n], also referred to as G(n), is obtained by looking up an entry in the LUT indexed by a representative value of feedback signal Y. A nearest neighbor LUT is considered here, but the optimization presented here is also applicable to linearly interpolation and higher orders of interpolation.

From the previously derived update equation, the LUT is updated as follows:

$$LUT[n] = LUT[n] + \delta_G$$

where $\delta_G$ is given by:

$$\delta_G = \varepsilon_k \times (I_o - jQ_o) \times \mu_k$$

The above equation should be normalized by the amplitude of the feedback signal to improve the update speed at low amplitude levels:

$$\delta_G = \varepsilon_k \times \frac{(I_o - jQ_o)}{\sqrt{I_o^2 + Q_o^2}} \times \mu_k$$

$$\delta_G = \varepsilon_k \times e^{-j arctan\left(\frac{Q_o}{I_o}\right)} \times \mu_k$$

It can be seen from this equation that the complex update ($\delta_G$) calculation requires the rotation of the error vector $\varepsilon_k$ by the opposite of the feedback signal's angle. That is achieved above by multiplying $\varepsilon_k$ with the complex conjugate of the baseband feedback signal ($I_o+jQ_o$) and normalizing by the feedback amplitude. This rotation shown above can be simplified and avoid the complex multiply and amplitude normalization by replacing $$\frac{(I_o - jQ_o)}{\sqrt{I_o^2 + Q_o^2}} \text{ with } (\text{sign}(I_o) - j \cdot \text{sign}(Q_o)).$$

This results in a "quantized" phase rotation by $$-k \times \frac{\pi}{4}$$

where k is the quadrant number containing the vector ($I_o+jQ_o$).

$$\delta_G = \varepsilon_k \times (\text{sign}(I_o) - j \cdot \text{sign}(Q_o)) \times \mu$$

$$= \varepsilon_k \times (\pm 1 \pm j) \times \mu$$

$$= \varepsilon_k \times \sqrt{2 \times} e^{-jk\frac{\pi}{4}} \times \mu$$

This new operation can be implemented very efficiently in hardware without requiring multipliers. Only two additions/subtractions are really needed. In addition to that, since amplitude normalization is not required the update factor does not need to be amplitude dependent and can be maintained constant. Extensive simulations have shown this method results in exactly equal performance when compared to previous approaches, even with exaggerated AM-AM and AM-PM characteristics.

Update Calculation for Linearly Interpolated LUT

In the case of the linearly interpolated LUT, two consecutive entries are interpolated to provide the complex gain factor. In this case, the error is given by:

$$\varepsilon_k = (I_p + jQ_p) - LUT_i \times (I_o + jQ_o)$$

Where LUT$i$ is given by:

$$LUT_i = LUT[n] + \text{interp\_factor} \times (LUT[n+1] - LUT[n])$$

Since the LUT output is computed by linearly interpolating two entries, both of them will be simultaneously updated. The update to each of the two entries will be proportional to its contribution to the output as described by the following equation:

$$LUT[n] = LUT[n] + (1 - \text{interp\_factor}) \times \delta_G$$

$$LUT[n+1] = LUT[n+1] + \text{interp\_factor} \times \delta_G$$

As in the single entry case, the low complexity $\delta_G$ is given by:

$$\delta_G = \varepsilon_k \times (\text{sign}(I_o) - j \cdot \text{sign}(Q_o)) \times \mu$$

$$= \varepsilon_k \times (\pm 1 \pm j) \times \mu$$

$$= \varepsilon_k \times \sqrt{2 \times} e^{-jk\frac{\pi}{4}} \times \mu$$

where k is the quadrant number containing a vector ($I_o+jQ_o$) corresponding to normalized feedback signal $\tilde{Y}$, and μ is an update factor (real-valued) that controls the speed of convergence.

Adaptive Loop Gain Normalization

The predistortion update mechanism is very sensitive to loop gain normalization variations. It must therefore be very accurate. The initial computed normalization 1/K used in normalization module 612, which is the product of the TX gain, the coupling factor and the LNA gain, for normalization is only an estimate and is not expected to be very accurate, due to intractable temperature variations etc. . . . Therefore an adaptive gain normalization block 614 is used to improve the normalization accuracy.

An adaptive loop gain normalization block 614 is introduced for the following reasons:

- The system can only provide an estimate of the overall loop gain
- The gains of different components in feedback loop vary with temperature. The predistorter adaptation will try to compensate for the linear gain variations (as opposed to just nonlinear components), causing the LUT curve to move up and down. This will create curve discontinuities since the updates are only local.
- In addition to creating discontinuities when the linear component of the predistortion curve varies, the accuracy of open-loop power control will be severely degraded.
- A complex adaptive gain normalization block is chosen to also remove phase shifts that could be due to changes in matching conditions etc. . . . Those phase shifts could also cause temporary discontinuities in real and imaginary LUT curves because of the local nature of the update.

Figure 8:
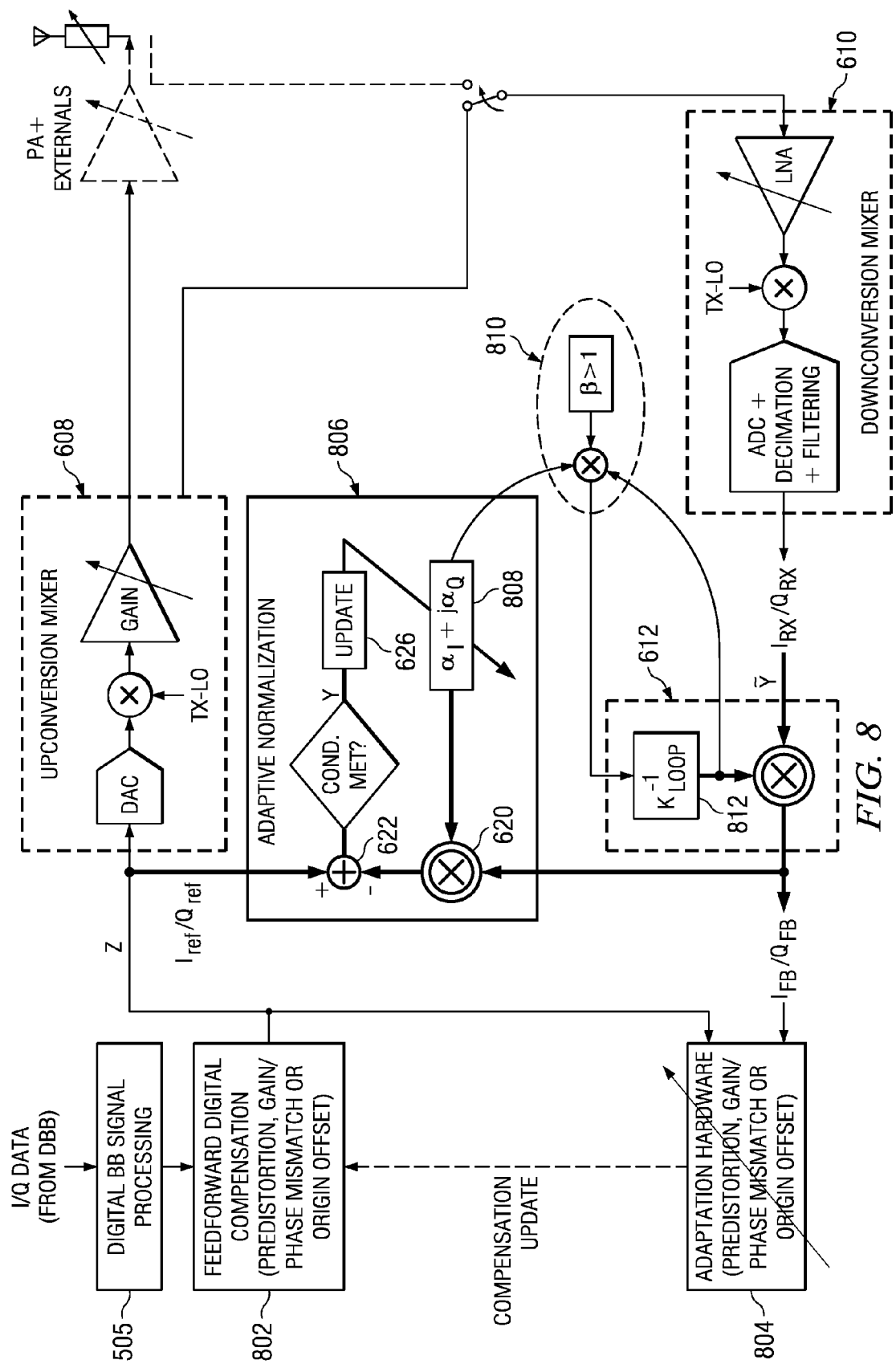
FIG. 8 is a block diagram illustrating the adaptive gain/phase normalization mechanism of FIG. 6.

The computation of the adaptive normalization is illustrated in FIG. 8. In FIG. 8, adaptive loop gain normalization block 614 is roughly represented by adaptive normalization mechanism 806. Forward compensation block 802 represents LUT 604 and related circuitry. Adaptation module 804 represents LUT 618 and related circuitry. A complex factor $\alpha = \alpha_I + j\alpha_Q$ in register 808 is adapted such that $$I_p + jQ_p = \alpha \times (I_o + jQ_o),$$

over the linear code region only, such as region 402 or 404 in FIG. 4A or 4B respectively. For example, linear regions 402, 404 are in a range of approximately 12 dB back-off or more. After convergence of 1/K, normalization is then updated by multiplying it with α and an additional real scaling factor β. This update of 1/K can be handled by the script processor. The update to α is applied only when $(I_p + jQ_p)$ falls in the linear region, 402 or 404 for example. A simple implementation consists in testing if both $|I_p|$ and $|Q_p|$ are smaller than a threshold. The threshold should be programmable and could be set to a power of 2 to further reduce the implementation complexity. It is assumed that the AM-PM variations are very small in the linear region. In case of larger variations the update coefficient can be reduced to provide further averaging.

The update equation for α is similar to the predistorter update. The LUT is simply replaced by the register 808 containing α. This can be done with a multiplexor or other selection logic. First the error is computed:

$$e_k = (I_p + jQ_p) - \alpha_k^*(I_o + jQ_o)$$

where $(I_p + jQ_p)$ is the feed forward signal and $(I_o + jQ_o)$ is the feedback signal.

Then update is applied by update logic 626:

$$e_{k+1} = e_k + \mu \times (I_O - jQ_O)$$

where μ is an update factor (real-valued) that controls the speed of convergence.

Therefore the same hardware can be reused since the predistorter update should be activated only after correct loop normalization is done. The only additional function is the required testing to determine if the signal is in the linear region. This is implemented very efficiently if the chosen threshold is a power of 2, in which case update logic 626 only needs to test a single bit. It should be noted that the convergence of α is several orders of magnitude faster than the predistortion LUT convergence since all qualifying samples are used to update a single register as opposed to several entries of the LUT.

After convergence, a correction by a real factor β must be performed. This factor β must be greater than or equal to the maximum compression at peak code, over all operating conditions (process, voltage, temperature, VSWR etc. . . . ). It is used to make sure that the peak signal amplitude at the output of the predistorter is equal or less than the input's, so that the same bit representation is maintained at both input and output ports. The magnitude of the LUT gain will therefore be maintained less than 1. If this additional correction is skipped then the predistorter will expand the range of the feed forward predistortion output signal potentially causing overflows unless the bit width of the output is adequately set.

After convergence, the normalization factors α and 1/K, and the real correction factor β are combined 810 into a single complex multiplier and stored in the 1/K register 812 by the script processor prior to activating predistortion update.

Figure 9:
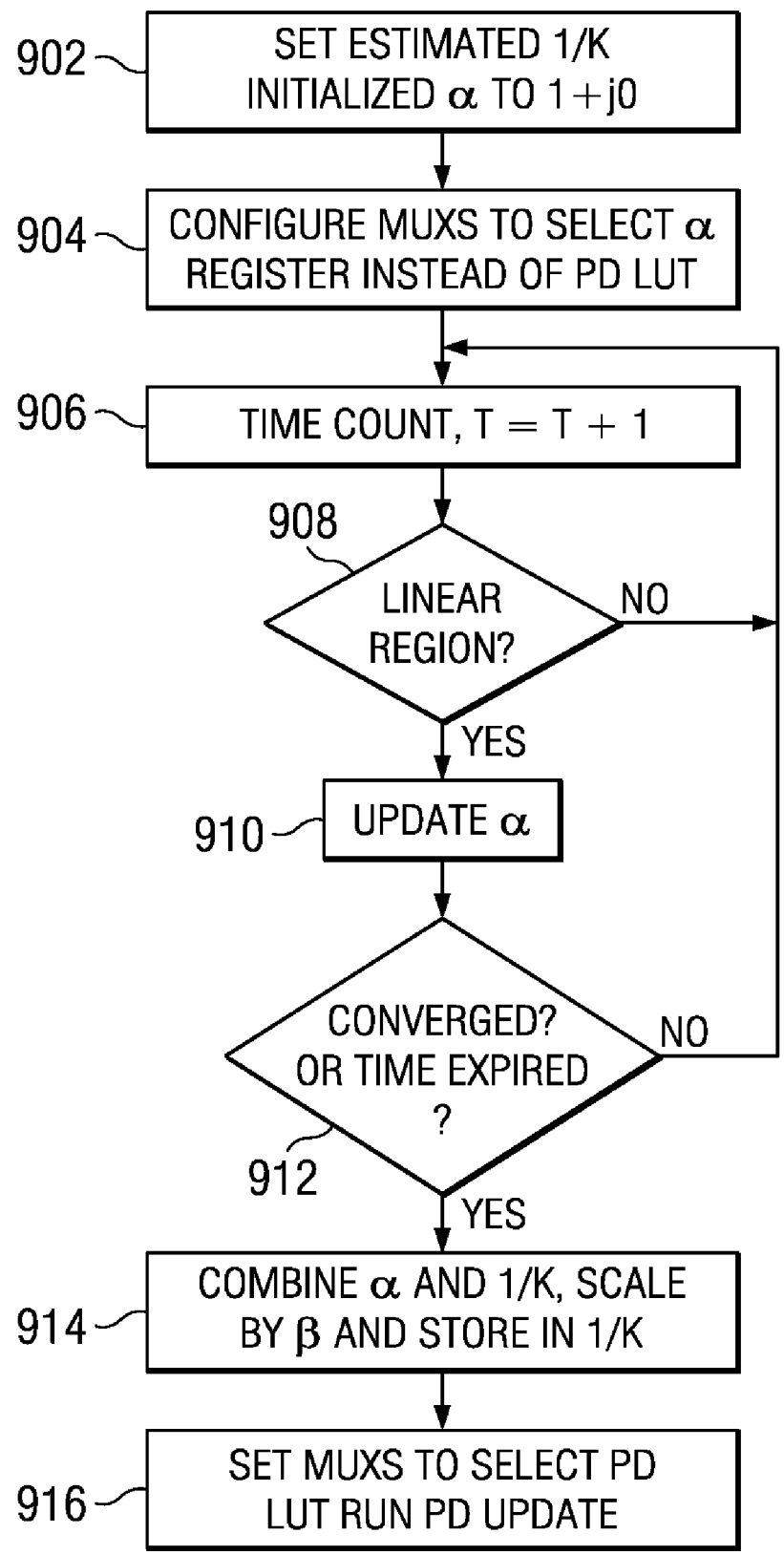
FIG. 9 is a flow diagram illustrating operation of the adaptive normalization and predistortion.

A flow chart of the adaptive gain normalization is shown in FIG. 9. Periodically an adaptive gain/phase normalization operation is performed. To begin, an estimated 1/K value is selected 902 and placed in 1/K register 812. α register 808 is initialized to 1+j0. Selection multiplexers are configured 904 to select α register 808 in place of predistortion adjustment LUT 618. A time counter is then initialized 906.

Samples of complex input signal Z are tested 908 to determine if they are in the linear region of nonlinear device 608. If yes, then α register 808 is updated 910; otherwise the time count is incremented 908 and the linearity test repeated on the next sample of input signal Z. This process repeats until α and 1/K converge 912 or until the time counter expires. Typically, convergence occurs in less than 10 us. At this point, α register 808 and 1/K normalization register 812 are multiplied together and scaled 914 by a predetermined constant β value in order to guarantee the magnitude of the LUT gain will be maintained less than 1. The multiplexers are then reset to select 916 predistortion adjustment LUT 618. Predistortion updates are then performed for a period of time until the adaptive normalization process is then repeated.

Figure 10A:
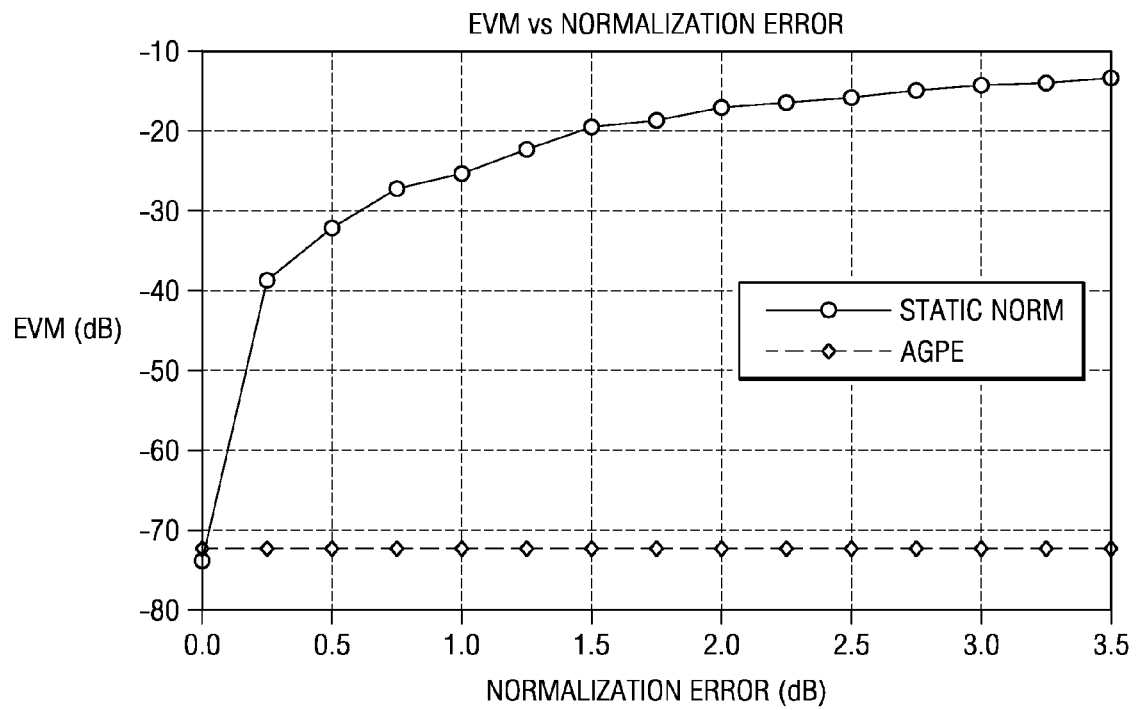
FIGS. 10A and 10B are plots comparing EVM and ACLR1, respectively, performance with adaptive gain/phase normalization.
Figure 10B:
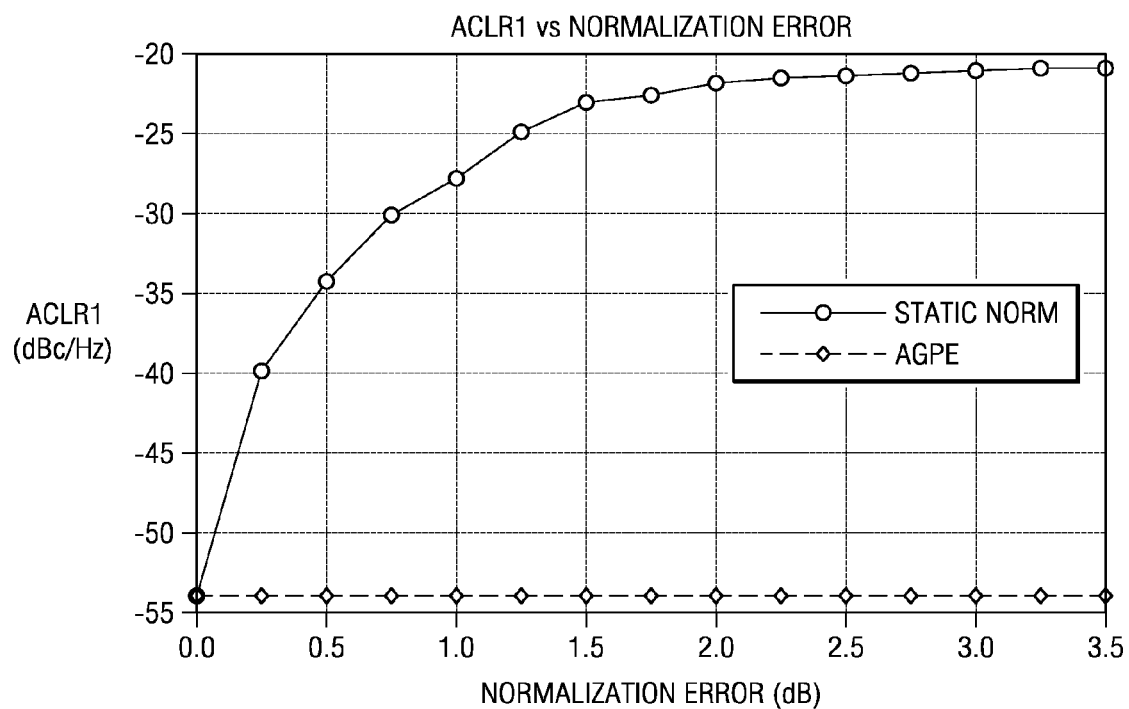

FIGS. 10A and 10B are plots comparing EVM and ACLR1, respectively, performance with adaptive gain/phase normalization as opposed to static normalization. As illustrated, gain variation up to +/−20 dB are accommodated, with an accuracy better than 0.1 dB. Phase correction accuracy across the dynamic range is better than 5 degrees.

Efficient Amplitude Approximation

The exact computation of the amplitude from I/Q signals requires a square root computation which is unpractical at high data processing rate (30.72 MHz). Therefore an approximation with less complexity is used.

The approximation works by first rotating the complex number so that its angle is between 0 and π/4. This is simply done by calculating new real and imaginary parts (X and Y respectively) as follows:

$$X = \max(|I|, |Q|)$$

$$Y = \min(|I|, |Q|)$$

Then the amplitude is simply approximated by a linear combination of X and Y:

$$R = \begin{cases} a_1 X + b_1 Y & 0 \le \theta < \theta_B \\ a_2 X + b_2 Y & \theta_B \le \theta < \frac{\pi}{4} \end{cases}$$

where $\theta$ is the angle of X+jY, which is between 0 and $\pi/4$.

Several exemplary sets of parameters $a_x$, $b_x$ and $\theta_B$ are defined in Table 1 for different options with increasing implementation complexity. The table gives $\tan(\theta_B)$. Since $\tan()$ is a strictly monotonic increasing function, comparing two angles is the same as comparing their tangents. Therefore, since the tangent is given as fraction $\tan(\theta_B)=c/d$, comparing $\theta$ and $\theta_B$ is equivalent to comparing d×Y and c×X.

TABLE 1

Parameters for 13 linear magnitude approximations

| Method# | $a_1$ | $b_1$ | tan ($\theta_B$) | $a_2$ | $b_2$ |
|---|---|---|---|---|---|
| 1 | 1 | 0 | 1 | — | — |
| 2 | 1 | 1 | 1 | — | — |
| 3 | 1 | 1/2 | 1 | — | — |
| 4 | 1 | 1/4 | 1 | — | — |
| 5 | 1 | 3/8 | 1 | — | — |
| 6 | 31/32 | 3/8 | 1 | — | — |
| 7 | 1 | 0 | 1/4 | 7/8 | 1/2 |
| 8 | 1 | 1/4 | 1/2 | 3/4 | 3/4 |
| 9 | 1 | 1/8 | 11/29 | 53/64 | 37/64 |
| 10 | 0.94800 | 0.39300 | 1 | — | — |
| 11 | 0.96043 | 0.39782 | 1 | — | — |
| 12 | 0.98644 | 0.23287 | 1/2 | 0.81651 | 0.58851 |
| 13 | 0.99030 | 0.19698 | tan ($\pi/8$) | 0.83954 | 0.56094 |

From Table 1, method 1 to method 9 can be implemented without a multiply, using only shifters and adders. Methods 10 to 13 require multiplications.

The above result suggests that on methods 6, 7 and 9 are preferable. These methods do not require multiplies and achieve relatively good approximations of the amplitude. The impact of these amplitude approximations on the performance of the feed-forward predistortion and adaptation process was simulated with Simulink test bench. All three methods meet the specifications across all the performance parameters considered. Method 9 provides a far better approximation with a performance very close to the ideal amplitude computation. Therefore method 9 provides the best trade-off between accuracy and implementation complexity.

Figure 11:
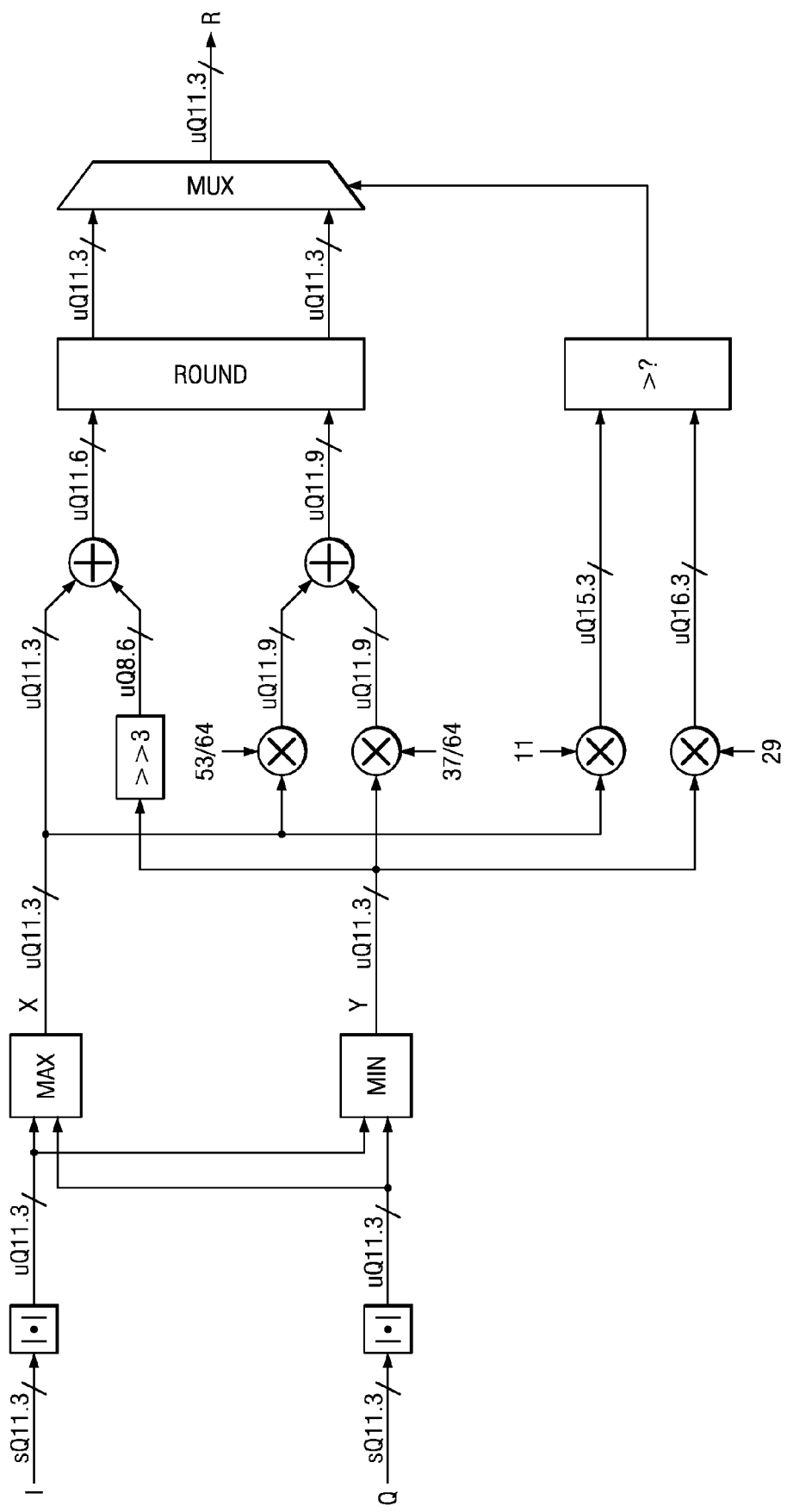
FIG. 11 is a block diagram illustrating a module to determine approximate amplitude for indexing the look up tables of FIG. 6.

FIG. 11 is a block diagram illustrating a module to determine approximate amplitude for indexing the predistortion look-up tables. It is an embodiment of method 9 from Table 1. It can be implemented with nine shift operations, six additions and two multiplexers.

System Embodiment

Figure 12:
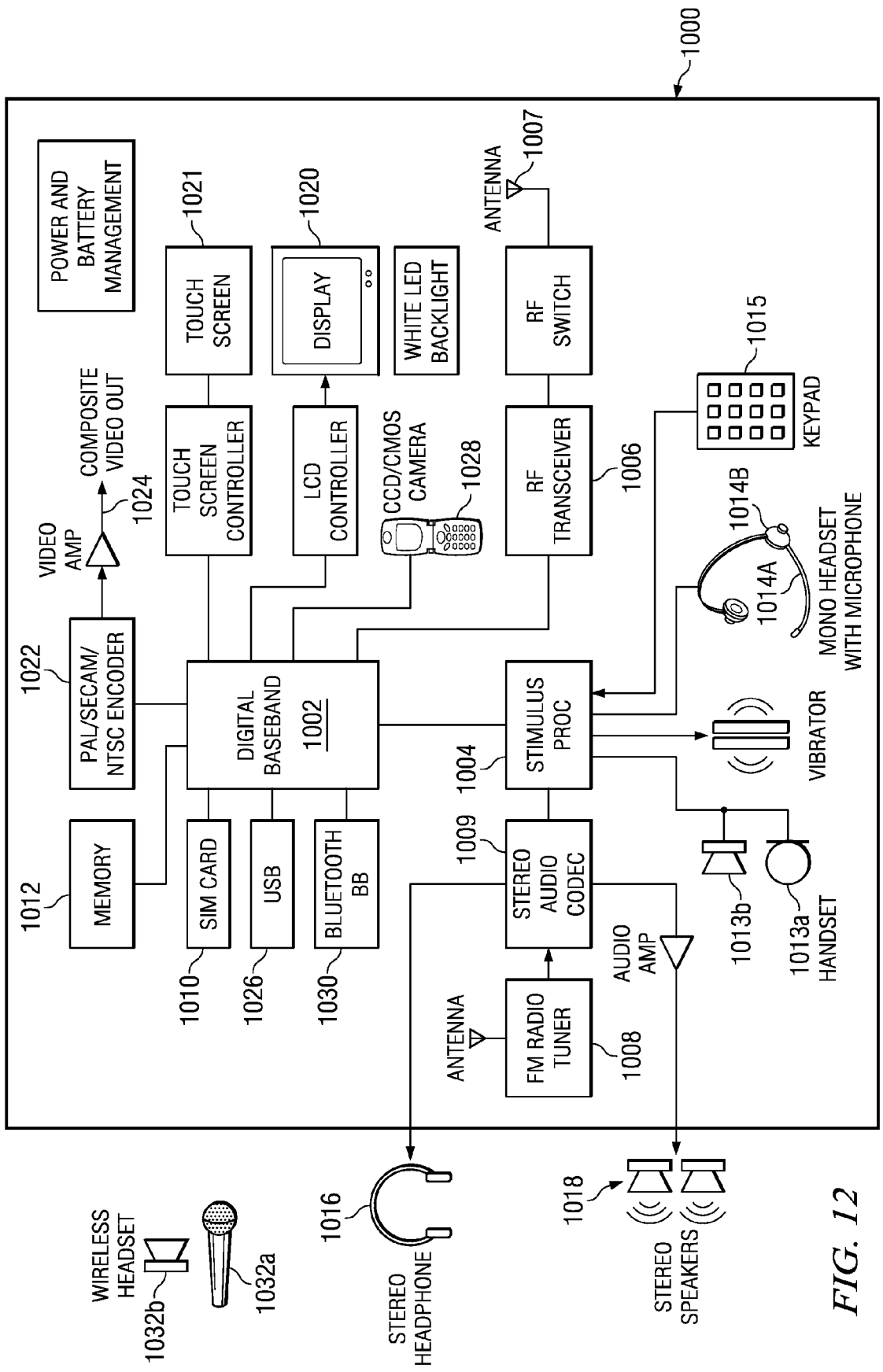
FIG. 12 is a block diagram of a cellular telephone with an embodiment of a transmitter using adaptive normalization and predistortion.

FIG. 12 is a block diagram of mobile cellular phone 1000 for use in the network of FIG. 1. Digital baseband (DBB) unit 1002 can include a digital processing processor system (DSP) that includes embedded memory and security features. Stimulus Processing (SP) unit 1004 receives a voice data stream from handset microphone 1013*a* and sends a voice data stream to handset mono speaker 1013*b*. SP unit 1004 also receives a voice data stream from microphone 1014*a* and sends a voice data stream to mono headset 1014*b*. Usually, SP and DBB are separate ICs. In most embodiments, SP does not embed a programmable processor core, but performs processing based on configuration of audio paths, filters, gains, etc being setup by software running on the DBB. In an alternate embodiment, SP processing is performed on the same processor that performs DBB processing. In another embodiment, a separate DSP or other type of processor performs SP processing.

RF transceiver 1006 is a digital radio processor as and includes a receiver for receiving a stream of coded data frames from a cellular base station via antenna 1007 and a transmitter for transmitting a stream of coded data frames to the cellular base station via antenna 1007. As described in more detail above, at the heart of transceiver 1006 lies a digitally controlled oscillator (DCO), which deliberately avoids any analog tuning controls. Fine frequency resolution is achieved through high-speed dithering of its varactors. Digital logic built around the DCO realizes an interpolative all-digital PLL (ADPLL) that is used as a local oscillator for both the transmitter and receiver and operates as described above. The Cartesian transmitter architecture utilizes the wideband direct frequency modulation capability of the ADPLL and a digitally controlled power amplifier (DPA) for the power ramp and amplitude modulation. In this embodiment, a single transceiver supports both GSM and WCDMA operation but other embodiments may use multiple transceivers for different transmission standards. Other embodiments may have transceivers for a later developed transmission standard with appropriate configuration. RF transceiver 1006 is connected to DBB 1002 which provides processing of the frames of encoded data being received and transmitted by cell phone 1000.

The basic WCDMA DSP radio consists of control and data channels, rake energy correlations, path selection, rake decoding, and radio feedback. Interference estimation and path selection is performed by instructions stored in memory 1012 and executed by DBB 1002 in response to signals received by transceiver 1006. Programmable features of the ADPLL within transceiver 1006 are controlled by instructions executed by DBB 1002.

Transceiver 1006 includes an embodiment of the present invention to perform adaptive gain/phase normalization and adaptive complex gain predistortion, as described in more detail above. In this embodiment of the invention, a least means squared (LMS) based adaptation technique is used for a complex gain lookup table (LUT) to track the temperature variations of the transmitter's nonlinear characteristics during operation. The algorithm is optimized to enable a low complexity hardware implementation and provides relatively fast convergence. An amplitude approximation method that is suitable to address the complex gain LUT is embodied that avoids the computation of square root. Also, an adaptive loop gain/phase normalization technique is embodied that avoids the appearance of curve discontinuities and maintains the accuracy of open loop power control. It reuses the existing LUT adaptation hardware and therefore is inexpensive to implement.

DBB unit 1002 may send or receive data to various devices connected to universal serial bus (USB) port 1026. DBB 1002 can be connected to subscriber identity module (SIM) card 1010 and stores and retrieves information used for making calls via the cellular system. DBB 1002 can also connected to memory 1012 that augments the onboard memory and is used for various processing needs. DBB 1002 can be connected to Bluetooth baseband unit 1030 for wireless connection to a microphone 1032*a* and headset 1032*b* for sending and receiving voice data. DBB 1002 can also be connected to display 1020 and can send information to it for interaction with a user of the mobile UE 1000 during a call process. Display 1020 may also display pictures received from the network, from a local camera 1028, or from other sources such as USB 1026. DBB 1002 may also send a video stream to display 1020 that is received from various sources such as the cellular network via RF transceiver 1006 or camera 1028. DBB 1002 may also send a video stream to an external video display unit via encoder 1022 over composite output terminal 1024. Encoder unit 1022 can provide encoding according to PAL/SECAM/NTSC video standards. In some embodiments, audio codec 1009 receives an audio stream from FM Radio tuner 1008 and sends an audio stream to stereo headset 1016 and/or stereo speakers 1018. In other embodiments, there may be other sources of an audio stream, such a compact disc (CD) player, a solid state memory module, etc Other Embodiments While the invention has been described with reference to illustrative embodiments, this description is not intended to be construed in a limiting sense. Various other embodiments of the invention will be apparent to persons skilled in the art upon reference to this description. This invention applies to all scheduled communication systems which use digitally controlled oscillators. This invention applies in uplink and downlink. Various embodiments of this invention apply for many modulation strategies, which include but are not limited to, OFDMA, CDMA, DFT-spread FDMA, SC-OFDMA, and others. Embodiments of this invention can be applied in most if not all emerging wireless standards, including EUTRA.

While a mobile user equipment device has been described, embodiments of the invention are not limited to mobile devices. Desktop equipment and other stationary equipment being served by a cellular network may also embody an ADPLL as described herein.

Although the invention finds particular application to Digital Signal Processors (DSPs), implemented, for example, in an Application Specific Integrated Circuit (ASIC), it also finds application to other forms of processors. An ASIC may contain one or more megacells which each include custom designed functional circuits combined with pre-designed functional circuits provided by a design library.

An embodiment of the invention may include a system with a processor coupled to a computer readable medium in which a software program is stored that contains instructions that when executed by the processor perform the functions of modules and circuits described herein. The computer readable medium may be memory storage such as dynamic random access memory (DRAM), static RAM (SRAM), read only memory (ROM), Programmable ROM (PROM), erasable PROM (EPROM) or other similar types of memory. The computer readable media may also be in the form of magnetic, optical, semiconductor or other types of discs or other portable memory devices that can be used to distribute the software for downloading to a system for execution by a processor. The computer readable media may also be in the form of magnetic, optical, semiconductor or other types of disc unit coupled to a system that can store the software for downloading or for direct execution by a processor.

As used herein, the terms "applied," "connected," and "connection" mean electrically connected, including where additional elements may be in the electrical connection path. "Associated" means a controlling relationship, such as a memory resource that is controlled by an associated port. The terms assert, assertion, de-assert, de-assertion, negate and negation are used to avoid confusion when dealing with a mixture of active high and active low signals. Assert and assertion are used to indicate that a signal is rendered active, or logically true. De-assert, de-assertion, negate, and negation are used to indicate that a signal is rendered inactive, or logically false.

It is therefore contemplated that the appended claims will cover any such modifications of the embodiments as fall within the true scope and spirit of the invention.

What is claimed is:

1. A system comprising a Cartesian transmitter, wherein the transmitter comprises:
    a transmit chain configured to receive an input signal X having in-phase and quadrature components and having a pre-distorter configured to employ a first compensation lookup table operable to hold complex valued entries to carry out in-phase and quadrature pre-distortion with respect to the input signal to form a pre-distorted signal Z, and a nonlinear element configured to process pre-distorted signal Z to form an output signal Y;
    a receiver coupled to receive output signal Y and operable to provide a feedback signal in a feedback loop;
    an adaptive normalization mechanism operable receive the feedback signal and operable to produce an adaptively normalized feed back signal $\tilde{Y}$, using an adaptively updated complex gain normalization parameter; and
    a pre-distortion update module operable to update the at least one compensation lookup table based on the pre-distorted signal Z and the adaptively normalized feedback signal $\tilde{Y}$.

2. The system of claim 1, wherein the pre-distortion update module comprises:
    a second compensation lookup table operable to hold complex valued entries to carry out in-phase and quadrature post-distortion with respect to the adaptively normalized feedback signal $\tilde{Y}$ signal to form a post-distorted feedback signal Zfb, and
    an error detection module for determining a difference in real and imaginary parts between a delayed sample of pre-distorted signal Z and a corresponding sample of post-distorted feedback signal Zfb.

3. The system of claim 2, wherein the adaptive normalization mechanism is operable to temporarily substitute a single register for the second compensation lookup table while updating the complex gain normalization parameter; and
    wherein the adaptive normalization mechanism is operable to iteratively converge on a revised gain normalization parameter using the single register to determine a complex value equal to approximately the inverse of a combined gain of the non-linear device over a linear region and components of the feedback loop, such that a resulting loop gain is approximately one.

4. The system of claim 3, wherein the adaptive normalization mechanism is further operable to multiply the revised gain normalization value by a scale factor to produce the updated complex gain normalization parameter.

5. The system of claim 1, wherein the transmit chain further comprises a combiner configured to combine an entry from the first compensation lookup table with the input signal X, wherein the entry is indexed by a representation of the input signal X.

6. The system of claim 1, wherein;
    the transmit chain further comprises an approximation module to produce an amplitude approximation value for each sample of the input signal X, wherein the first compensation lookup table is indexed by the amplitude approximation value; and
    the pre-distortion compensation module further comprises an approximation module to produce an amplitude approximation value for each sample of the normalized feed back signal $\tilde{Y}$, wherein the first compensation lookup table is indexed by the amplitude approximation value.

7. The system of claim 6, wherein the approximation module is operable to determine an approximate amplitude of a complex sample having a real portion, I and an imaginary portion Q according to:

$$R = \begin{cases} a_1 X + b_1 Y & 0 \le \theta < \theta_B \\ a_2 X + b_2 Y & \theta_B \le \theta < \frac{\pi}{4} \end{cases}$$

where $X = \max(|I|, |Q|)$ $Y = \min(|I|, |Q|)$ $a_1$, $a_2$, $b_1$, $b_2$, and $\theta$ are selected parameters.

8. The system of claim 2, wherein an entry LUT[n] in the lookup table selected in response to the adaptively normalized feedback signal $\tilde{Y}$ is updated according to $$LUT[n] = LUT[n] - \frac{\mu}{2} \times \frac{\partial E[|\varepsilon_k|^2]}{\partial LUT[n]}$$
$$\approx LUT[n] + \mu \times \tilde{Y}^* \times \varepsilon_k$$

where:
LUT[n] indicates an entry in the second compensation lookup table,
$\tilde{Y}^*$ is a complex conjugate value of the normalized feedback signal $\tilde{Y}$,
$\varepsilon_k$ is an error signal corresponding to a difference between pre-distorted signal Z and post-distorted signal Zfb; and
$\mu$ is an update factor (real-valued) that controls the speed of convergence.

9. The system of claim 2, wherein an entry LUT[n] in the lookup table selected in response to the adaptively normalized feedback signal $\tilde{Y}$ is updated according to $LUT[n] = LUT[n] + \delta_G$ where:

$$\delta_G = \varepsilon_k \times (\text{sign}(I_o) - j \cdot \text{sign}(Q_o)) \times \mu$$
$$= \varepsilon_k \times (\pm 1 \pm j) \times \mu$$
$$= \varepsilon_k \times \sqrt{2} \times e^{-jk\frac{\pi}{4}} \times \mu$$

where k is the quadrant number containing a vector ($I_o + jQ_o$) corresponding to normalized feedback signal $\tilde{Y}$, and
$\mu$ is an update factor (real-valued) that controls the speed of convergence.

10. The system of claim 9, wherein an entry LUT[n] in the lookup table is selected by determining an approximate amplitude of a complex sample value of signal $\tilde{Y}$.

11. The system of claim 1 being a cellular phone comprising the transmit chain.

12. A method for transmitting Cartesian symbols, comprising:
pre-distorting an input signal X having in-phase and quadrature components using a first compensation lookup table operable to hold complex valued entries to carry out in-phase and quadrature compensation pre-distortion with respect to the input signal to form a pre-distorted signal Z;
processing pre-distorted signal Z to form an output signal Y using a nonlinear element;
adaptively updating a complex gain normalization parameter to reflect varying gain of a linear region of the nonlinear element;
forming a normalized feed back signal $\tilde{Y}$ using the adaptively updated complex gain normalization parameter; and
updating the first compensation lookup table based on the pre-distorted input signal Z and the adaptively normalized feedback signal $\tilde{Y}$.

13. The method of claim 12 wherein updating the first compensation table comprises:
post-distorting the adaptively normalized feedback signal $\tilde{Y}$ signal in a feedback loop to form a post-distorted feedback signal Zfb using a second compensation lookup table operable to hold complex valued entries to carry out in-phase and quadrature post-distortion with respect to the adaptively normalized feedback signal $\tilde{Y}$ signal;
determining an error difference in real and imaginary parts between a delayed sample of pre-distorted signal Z and a corresponding sample of post-distorted feedback signal Zfb;
updating an entry in the second compensation lookup table with a complex value that reduces the error difference; and
exchanging the second compensation lookup table and the first compensation lookup table.

14. The method of claim 13, wherein adaptively updating the complex gain normalization parameter comprises:
temporarily substituting a single register for the second compensation lookup table; and
iteratively converging on a revised gain normalization parameter using the single register to determine a complex value equal to approximately the inverse of a combined gain of the non-linear device over a linear region and components of the feedback loop, such that a resulting loop gain is approximately one.

15. The method of claim 14, further comprising multiplying the revised gain normalization value by a scale factor to produce the updated complex gain normalization parameter.

16. The method of claim 13,
wherein the first compensation lookup table is indexed by the amplitude approximation value of the input signal X; and
wherein the second compensation lookup table is indexed by the amplitude approximation value of the adaptively normalized feedback signal $\tilde{Y}$.

17. The method of claim 16, further comprising determining an approximate amplitude of a complex sample having a real portion, I and an imaginary portion Q according to:

$$R = \begin{cases} a_1 X + b_1 Y & 0 \le \theta < \theta_B \\ a_2 X + b_2 Y & \theta_B \le \theta < \frac{\pi}{4} \end{cases}$$

where:

$X = \max(|I|, |Q|)$ $Y = \min(|I|, |Q|)$ $a_1$, $a_2$, $b_1$, $b_2$, and $\theta$ are selected parameters.

18. The method of claim 13, wherein an entry LUT[n] in the lookup table selected in response to the adaptively normalized feedback signal $\tilde{Y}$ is updated according to $$LUT[n] = LUT[n] - \frac{\mu}{2} \times \frac{\partial E[|\varepsilon_k|^2]}{\partial LUT[n]}$$
$$\approx LUT[n] + \mu \times \tilde{Y}^* \times \varepsilon_k$$

where:

LUT[n] indicates an entry in the second compensation lookup table, $\tilde{Y}^*$ is a complex conjugate value of the normalized feedback signal $\tilde{Y}$, $\epsilon_k$ is an error signal corresponding to a difference between pre-distorted signal Z and post-distorted signal Zfb, $\mu$ is an update factor (real-valued) that controls the speed of convergence.

19. The method of claim 13, wherein an entry LUT[n] in the lookup table selected in response to the adaptively normalized feedback signal $\tilde{Y}$ is updated according to $$LUT[n]=LUT[n]+\delta_G$$

where $$\delta_G = \varepsilon_k \times (\text{sign}(I_o) - j \cdot \text{sign}(Q_o)) \times \mu$$
$$= \varepsilon_k \times (\pm 1 \pm j) \times \mu$$
$$= \varepsilon_k \times \sqrt{2 \times} \, e^{-jk\frac{\pi}{4}} \times \mu$$

and where k is the quadrant number containing a vector $(I_o+jQ_o)$ corresponding to normalized feedback signal $\tilde{Y}$.

20. The method of claim 19, wherein an entry LUT[n] in the lookup table is selected by determining an approximate amplitude of a complex sample value of signal $\tilde{Y}$.

* * * * *